United States Patent [19]
> Ormond

[11] 4,361,811
[45] Nov. 30, 1982

[54] DIFFERENTIAL AMPLIFIER SYSTEM
[76] Inventor: Alfred N. Ormond, 11969 E. Rivera Rd., Santa Fe Springs, Calif. 90670
[21] Appl. No.: 192,086
[22] Filed: Sep. 29, 1980
[51] Int. Cl.³ .......................... G06G 7/18; H03F 3/68
[52] U.S. Cl. .................................. 328/127; 330/69; 330/84; 330/258
[58] Field of Search .......................... 330/258, 69, 84; 328/127, 128

[56] References Cited
U.S. PATENT DOCUMENTS
3,732,501  5/1973  Fischer, Jr. et al. .............. 330/84 X
4,088,961  5/1978  Ashley ............................. 330/258 X
4,242,741  12/1980  Parrish ............................. 330/258 X

*Primary Examiner*—James B. Mullins
*Attorney, Agent, or Firm*—Ralph B. Pastoriza

[57] ABSTRACT

Two operational amplifiers are hooked in a different mode by unique circuitry so that the common mode gain is unity and the open loop gain is the same as the open loop gain of the individual amplifiers. Essentially, a negative feedback network feeds the common mode output signal back to the negative input terminals which cancels the common mode output signal. Practical applications are achieved by adding appropriate integrating capacitors between the output and negative inputs of the amplifiers with appropriate series resistances in the input leads.

2 Claims, 6 Drawing Figures

DIFFERENTIAL AMPLIFIER SYSTEM

This invention relates to a differential amplifier system and more particularly to a unique circuitry permitting two operational amplifiers to be hooked into a different mode so that the common mode gain is unity and the open loop gain is the same as the open loop gain of the individual amplifiers.

BACKGROUND OF THE INVENTION

Conventional operational integrator amplifier systems are usually single-ended; that is, there is only a single amplifier system employed. Accordingly, such systems are subject to common mode voltages such as alternating current pick-up from ground, IR voltage drops, and so forth introduced into the signal either through the positive or negative leads. In the case of integrated circuits using single chip amplifiers, temperature variations can result in serious drifts due to input off-set voltages and currents.

It would be desirable to provide a differential amplifier system particularly one utilizing operational integrating amplifiers wherein common mode voltage errors and the like as well as off-set voltages and currents resulting from temperature variations can be wholly avoided without the necessity of complicated and expensive auxiliary circuitry.

BRIEF DESCRIPTION OF THE PRESENT INVENTION

With the foregoing in mind, the present invention contemplates a fairly inexpensive and simple differential amplifier system wherein the above-noted problems can readily be overcome.

More particularly, the present invention contemplates the provision of first and second substantially identical amplifiers each having positive and negative input terminals and single output terminals. Two first resistances of equal value are connected in series between the negative input terminals of these amplifiers and two second resistances also of equal value are connected in series between the output terminals of the amplifiers. A common lead in turn is connected between the junction points of the two first resistances and two second resistances respectively, to provide a negative feedback network which feeds the common mode output signal at the output terminals back to the negative input terminals thereby cancelling the common mode output signal. The common mode gain on these two amplifiers is unity and the open loop gain of the two amplifiers is the same as the open loop gain of the individual amplifiers.

With the foregoing arrangement, the common mode voltages are cancelled as noted and in addition, by providing two substantially identical amplifiers in a chip, any drift resulting from off-set voltages is the same so that the output signal is not affected and there results a high order of compensation.

BRIEF DESCRIPTION OF THE DRAWINGS

A better understanding of this invention will be had by referring to the accompanying drawings in which.

DETAILED DESCRIPTION OF THE INVENTION

Figure 1:
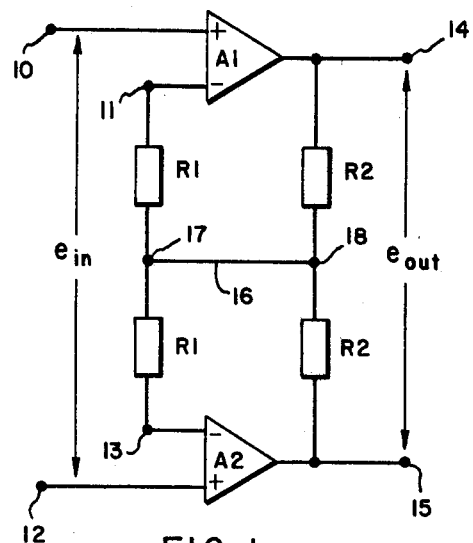
FIG. 1 is a basic electrical circuit diagram of the differential amplifier system of this invention wherein an input signal is applied to the positive terminals of the amplifiers.

Referring first to FIG. 1, the differential amplifier system includes first and second substantially identical amplifiers designated A1 and A2 each having positive and negative input terminals 10, 11 and 12, 13 respectively. The output terminals for the amplifiers are designated 14 and 15.

Two first resistances R1 of equal value are connected in series between the negative input terminals 11 and 13 of the amplifiers as shown. Two second resistances R2 of equal value, in turn, are connected in series between the output terminals 14 and 15 of the amplifiers.

A common lead 16 is connected between the junction points 17 and 18 between the first two resistances R1 and second two resistances R2, these junction points having the same potential for a pure differential input signal.

The foregoing resistance network constitutes a negative feedback network that feeds the common mode output back to the negative input terminals which cancels the common mode output signal. In FIG. 1, the input differential signal is applied to the positive terminals 10 and 12 as indicated at $e_{in}$ and the output signal is taken from the output terminals 14 and 15 as indicated $e_{out}$.

Figure 2:
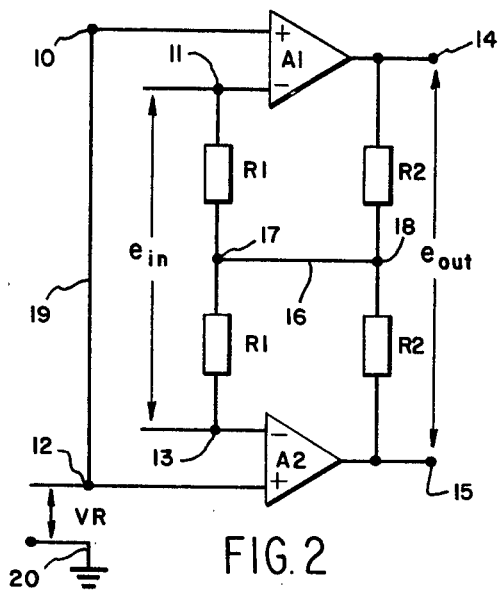
FIG. 2 is a circuit diagram similar to FIG. 1 but wherein the positive terminals of the amplifiers are tied together to a reference voltage and the input signal is applied to the negative terminals.

FIG. 2 illustrates a circuit similar to FIG. 1, identical components being designated by the same symbols. However, in FIG. 2, the positive input terminals 10 and 12 are tied together by common lead 19 into a reference voltage $V_R$ with respect to ground indicated at 20. The input voltage $e_{in}$, in turn, is applied to the negative input terminals 11 and 13. The output signal is again taken from the output terminals 14 and 15 as indicated at $e_{out}$.

Figure 3:
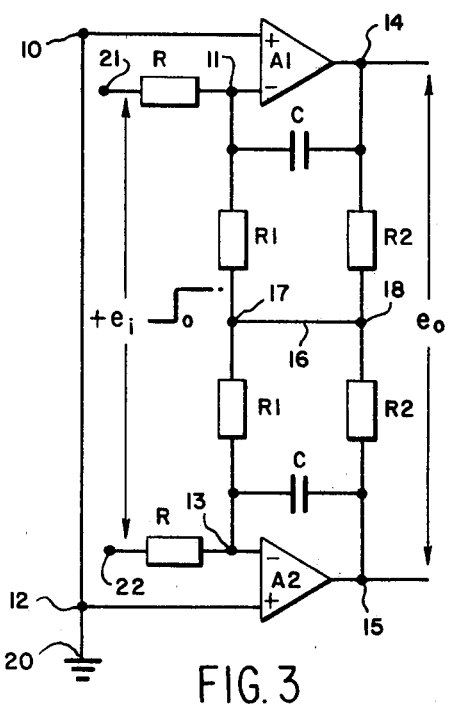
FIG. 3 illustrates certain additions to the circuit of FIG. 2 to provide an operational integrating amplifier system.

FIG. 3 shows a practical application of the differential amplifier system wherein the basic circuit of FIG. 2 is utilized with the addition of first and second input signal receiving terminals 21 and 22 together with input resistances R of equal value connected respectively between the first and second input signal receiving terminals and the negative input terminals 11 and 13 of the amplifiers A1 and A2. The positive input terminals 10 and 12 are tied together to ground 20. Integrating capacitors C of equal value connect directly between the outputs and negative input terminals of the amplifiers, respectively, as shown to provide with the input resistances R and associated differential amplifiers, operational integrating amplifiers for integrating an input signal applied to the input signal receiving terminals 21 and 22. Such an input signal is indicated at $+e_i$. There results an output signal $e_o$ which constitutes respective differential positive and negative voltage slopes when the input signal is positive as shown.

Figure 4:
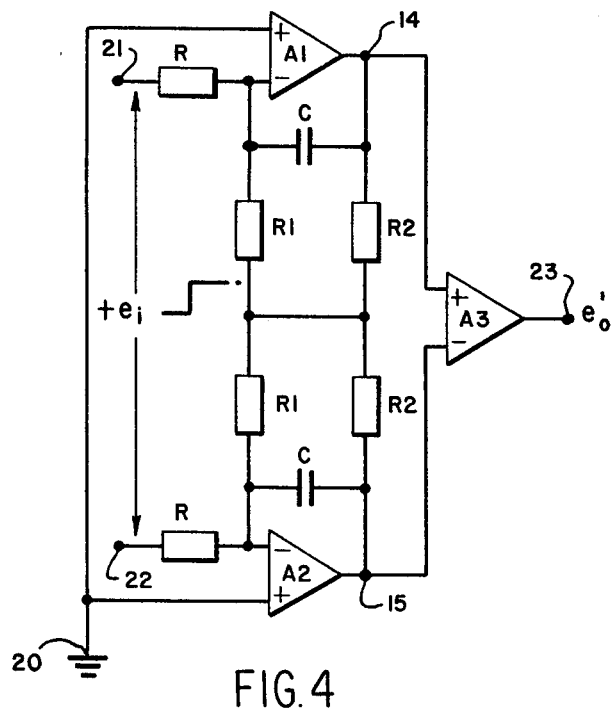
FIG. 4 shows the circuit diagram of FIG. 3 with the addition of a unity gain operational amplifier connected to the output.

FIG. 4 shows the same circuit as FIG. 3 with the addition of a unity gain operational amplifier A3 connected to receive at its input the signal on the output terminals 14 and 15 of the differential amplifiers A1 and A2. Essentially, the operational amplifier A3 sums the output signals from the amplifiers A1 and A2 to turn the described differential slopes into a single slope integral at the output 23. This single slope integral output signal is indicated at $e_o'$.

Figure 5:
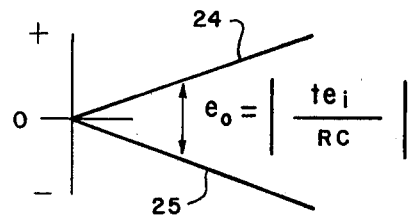
FIG. 5 shows positive and negative slopes representative of the output signal from the circuit of FIG. 3 when a positive input signal is applied; and, FIG. 6 represents the output from the unity gain operational amplifier of FIG. 4.

The heretofore referred to differential positive and negative voltage slopes constituting the output signal $e_o$ described with respect to the circuit of FIG. 3 is graphically illustrated in FIG. 5 at 24 and 25.

Figure 6:
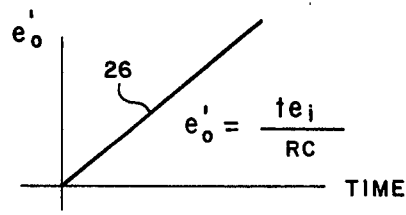

The single slope integral representing the output $e_o'$ for FIG. 4 is indicated in FIG. 6 at 26. The angle between the positive and negative slope lines 24 and 25 of FIG. 5 is identical to the angle of the slope for the line 26 in FIG. 6. The two output voltages as a function of time and the series resistances R and integrating capacitors C is given by the formulas indicated in FIGS. 5 and 6 respectively.

The integrator shown in FIGS. 3 and 4 cancels the common mode voltages that may appear either from the source or from the ground connection of the positive terminals. This cancellation may be of several orders of magnitude.

In addition, and as mentioned, by making the amplifiers A1 and A2 substantially identical and forming the same in a single chip as part of an integrated circuit, for example, drifts due to temperature changes will be the same in both amplifiers and thus cancelled.

From all of the foregoing, it can be seen that the present invention has provided a unique circuitry which is both simple and economical to thereby avoid problems characteristic of single ended operational amplifiers and integrators.

I claim:

1. A differential amplifier system including, in combination:
   (a) first and second substantially identical amplifiers each having positive and negative input terminals and single output terminals;
   (b) two first resistances of equal value connected in series between the negative input terminals of said amplifiers;
   (c) two second resistances of equal value connected in series between the output terminals of said amplifiers;
   (d) a common lead connected between the junction points of said two first resistances and two second resistances, respectively, to provide a negative feedback network which feeds the common mode output signal at said output terminals back to the negative input terminals thereby cancelling the common mode output signal, the common mode gain on the two amplifiers being unity and the open loop gain of the two amplifiers being the same as the open loop gain of the individual amplifiers;
   (e) first and second input signal receiving terminals;
   (f) input resistances of equal value connected respectively between said first and second input signal receiving terminals and said negative input terminals of said amplifier;
   (g) means connecting said positive input terminals together to ground; and,
   (h) integrating capacitors of equal value connected directly between the outputs and negative input terminals of said amplifiers, respectively, to provide with said input resistances and associated differential amplifiers operational integrating amplifiers for integrating an input signal applied to said input signal receiving terminals to provide an output signal with respective differential positive and negative voltage slopes when the input signal is positive.

2. A system according to claim 1, further including a unity gain operational amplifier connected to the single output terminals of said amplifiers to receive said output signal and sum the same to turn the differential slopes in a single slope integral.

* * * * *